United States Patent [19]

Yamashita et al.

[11] 4,419,768

[45] Dec. 6, 1983

[54] WIDEBAND TUNER FOR VHF, CATV AND UHF TELEVISION SIGNALS

[75] Inventors: Sadahiko Yamashita, Sagamihara; Mitsuo Saito, Kawasaki, both of Japan

[73] Assignee: Matsushita Electric Industrial Company, Limited, Osaka, Japan

[21] Appl. No.: 306,854

[22] Filed: Sep. 29, 1981

[30] Foreign Application Priority Data

Sep. 30, 1980 [JP] Japan .................................. 55-137206
Oct. 1, 1980 [JP] Japan .................................. 55-138162
Oct. 1, 1980 [JP] Japan .................................. 55-138163
Oct. 8, 1980 [JP] Japan .................................. 55-141698

[51] Int. Cl.³ .......................... H04B 1/26; H04B 1/16
[52] U.S. Cl. .................................... 455/180; 455/189; 455/190; 455/197; 455/315
[58] Field of Search ........................ 455/133, 140–144, 455/176, 180, 188–191, 197, 314, 315; 358/191.1

[56] References Cited

U.S. PATENT DOCUMENTS

| 3,571,723 | 3/1971 | Ogusu | 455/190 |
| 3,696,302 | 10/1972 | Gossard | 455/190 |
| 3,931,578 | 1/1976 | Gittinger | 455/190 |
| 3,987,400 | 10/1976 | Fathauer | 455/180 |
| 4,009,441 | 2/1977 | Kumagai et al. | 455/190 |
| 4,162,452 | 7/1979 | Ash | 455/315 |
| 4,214,212 | 7/1980 | Dipietromaria | 455/190 |

FOREIGN PATENT DOCUMENTS 2746931 4/1978 Fed. Rep. of Germany ...... 455/189

*Primary Examiner*—Jin F. Ng
*Attorney, Agent, or Firm*—Lowe, King, Price & Becker

[57] ABSTRACT

A wideband tuner for television signals in the VHF, CATV and UHF bands comprises a VHF tuning section coupled to a VHF receiving terminal, a CATV tuning section coupled to a CATV receiving terminal and a UHF tuning section. A switch selectively couples the UHF section to the output of the CATV tuning section or signals from a UHF receiving terminal. Each of the CATV and UHF tuning sections includes a differential mode modulator. In the CATV reception mode, the modulator of the CATV section converts the received CATV signal on an upper-side band differential mode to a UHF frequency, while the modulator of the UHF section converts the UHF frequency CATV signal to the standard intermediate frequency in a lower-side band differential mode. In the UHF reception mode, the UHF section modulator converts the UHF signal in an upper-side band differential mode to the standard intermediate frequency, while the CATV section is disabled.

16 Claims, 4 Drawing Figures

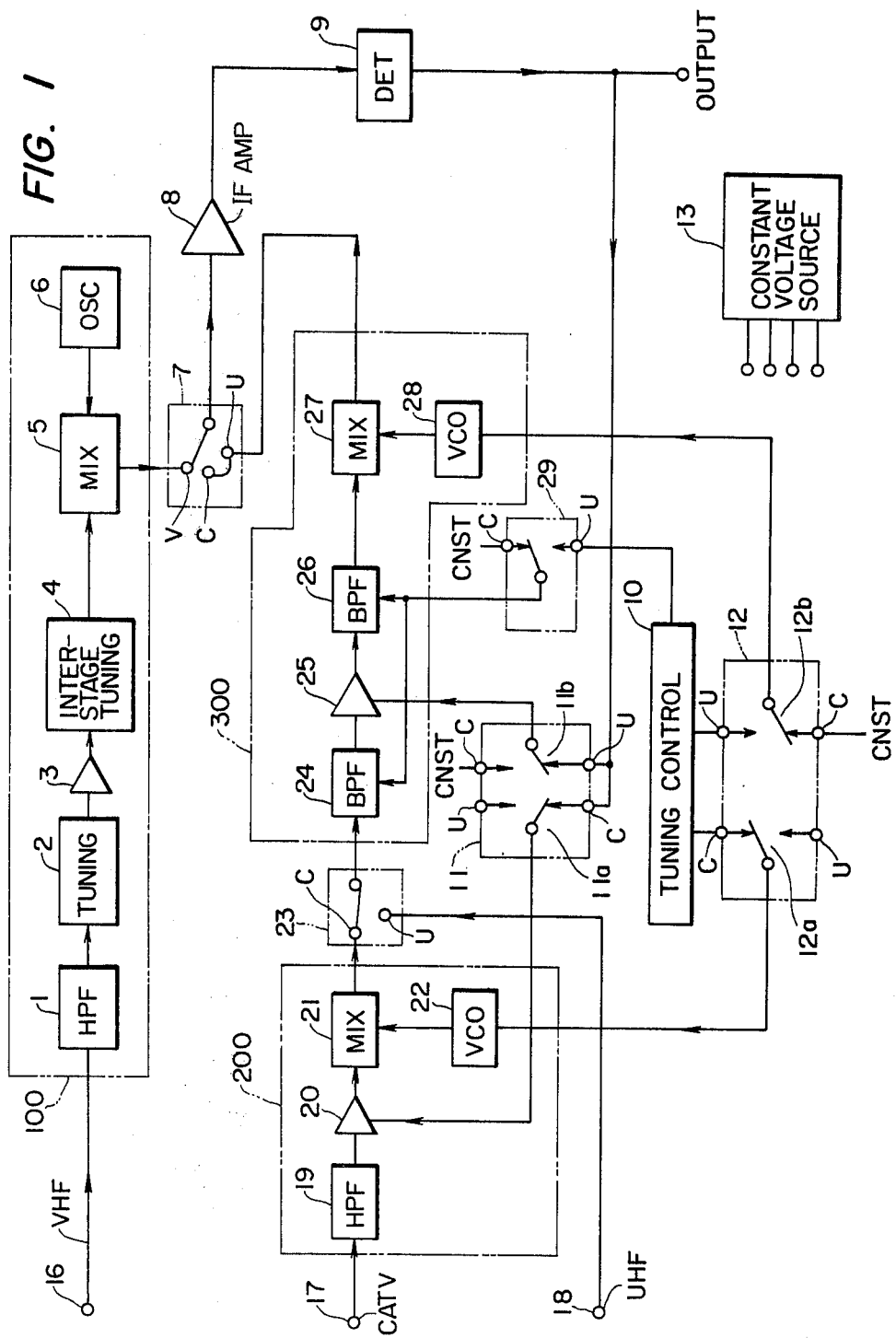

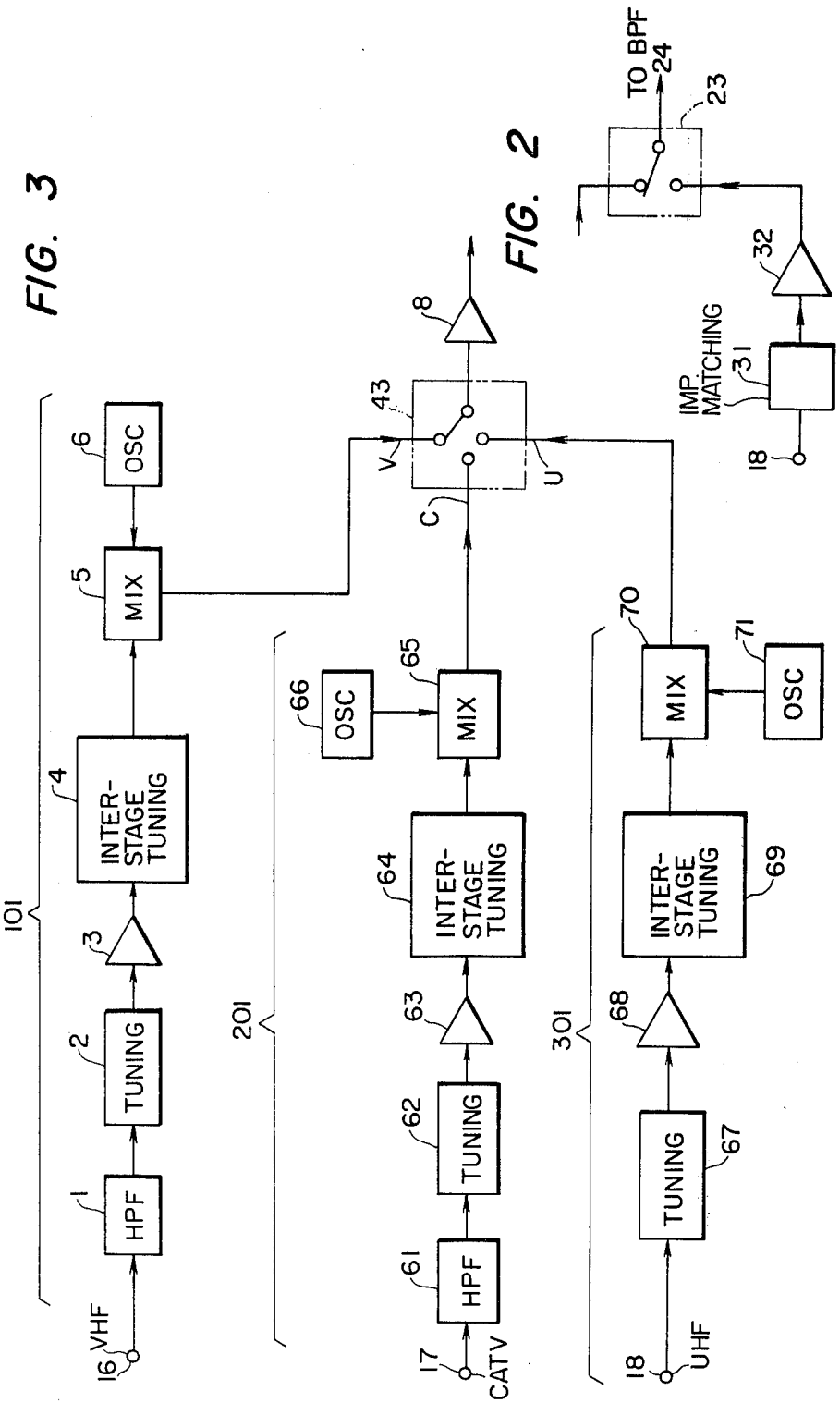

WIDEBAND TUNER FOR VHF, CATV AND UHF TELEVISION SIGNALS

BACKGROUND OF THE INVENTION

The present invention relates generally to wideband television tuners for signals in the VHF, CATV and UHF bands.

In a known wideband tuner for reception of television signals in the VHF, CATV and UHF bands as shown and described in Japanese Patent No. 53-38129, the CATV and UHF tuning sections are cascaded so that CATV signals are coupled to the CATV tuning section and converted into a UHF frequency and fed to the UHF tuning section for further frequency conversion to the standard video intermediate frequency, while UHF signals are coupled direct to the UHF section for conversion to the standard intermediate frequency. The CATV tuning section includes a local oscillator which supplies a carrier at a frequency lower than the frequency of the received CATV signal to a summing type mixer so that the output of the mixer is at a frequency which is a sum of frequencies of the carrier and the received signal, a modulation technique known as "a lower-side band summing mode". However, with this type of modulation an appreciable amount of spurious signals arising from the modulation falls in the bandwidth of the converted intermediate frequency signal. Other difficulties involved with the prior art tuner are poor selectivty, low sensitivity and high leakage current at the input to the CATV tuning section during UHF reception mode. In addition, the prior art tuner is complex in circuit design which can result in costly equipment.

SUMMARY OF THE INVENTION

According to a first aspect of the invention, the wideband tuner comprises first, second and third input terminals adapted to receive signal of low, medium and high frequency bands during low, medium and high frequency band reception modes, respectively. More specifically, the low, medium and high frequency bands generally correspond to the VHF, CATV and UHF bands, respectively. A first, or VHF tuning section is coupled to receive signals of the low frequency band (VHF) from the first input terminal for converting the received signals to the standard intermediate frequency for application to the intermediate frequency video amplifier of the television receiver. A second, or CATV tuning section is coupled to receive signals of the medium frequency band (CATV) from the second input terminal for converting the received signals to a higher intermediate frequency in the UHF band. A third, or UHF tuning section is coupled through a first switch to the ouput of the CATV tuning section for converting an input signal applied thereto to the standard intermediate frequency. The first switch is arranged to selectively couple the the output of the CATV tuning section during the medium frequency band reception mode or UHF signals from the third input terminal during the high frequency band reception mode. A second switch is provided for selectively coupling to the video amplifier the output of the VHF tuning section during the low frequency band reception mode or the output of the UHF tuning section during the medium or high frequency band reception mode. The CATV tuning section includes a differential mode modulator for modulating a first carrier at a manually controlled frequency higher than the frequency of a medium frequency band modulating signal during the medium frequency band reception mode. The UHF tuning section also includes a differential mode modulator for modulating a second carrier at a frequency lower than the higher intermediate frequency during the medium frequency band reception mode and for modulating a third carrier at a manually controlled frequency higher than the frequency of a high frequency band modulating signal during the high frequency band reception mode.

Because of the differential modulation mode in the CATV and UHF tuning sections, the amount of spurious enery in the signal of the standard intermediate frequency is quite small compared with the summing modulation mode.

According to a second aspect of the invention, the wideband tuner comprises a first input terminal adapted to receive signals of low and medium frequency bands (VHF and CATV, respectively) during low and medium frequency band reception modes, respectively, and a second input terminal adapted to receive signals of a high frequency band (UHF) during high frequency band reception mode. A first tuning section is coupled to receive signals of the low and medium frequency bands from the first input terminal for converting the received signals to a higher intermediate frequency which is in the UHF band. A second tuning section is included for converting an input signal applied thereto to a lower, or standard intermediate frequency for application to the video amplifier. A switch is provided for selectively coupling to the second tuning section the output of the first tuning section during the low or medium frequency band reception mode or signals of the high frequency band from the second input terminal in response to the high frequency band reception mode.

Since the first tuning section is commonly used for tuning either the VHF or CATV signal, the wideband tuner of the invention can be simplified with an attendant reduction in equipment cost.

Preferably, the wideband tuner comprises a tuning control circuit for generating a channel selecting signal in response to an operator action and the first tuning section comprises a first filter having passbands of low and high frequency ranges of the low and medium frequency bands and a second filter having a passband of intermediate frequencies between the low and high frequency ranges. A second switch is provided for selectively passing signals from the first input terminal through the first or second filter during the the low and medium frequency band reception modes. A variable frequency oscillator generates a carrier at a frequency variable as a function of the channel selecting signal during the low and medium frequency band reception modes, the variable frequency being higher than the frequency of the signal passing through the first or second filter. A mixer is supplied with the carrier for modulating it with modulating signals from the first or second filter for generating an output at a frequency equal to the difference between the frequencies of the carrier and the modulating signals.

BRIEF DESCRIPTION OF THE DRAWINGS

The invention will be described in further detail with reference to the accompanying drawings wherein:

FIG. 1 is a block diagram of an embodiment of the wideband tuner of the invention;

FIG. 2 is a block diagram of a modification of the embodiment of FIG. 1;

FIG. 3 is a block diagram of a further embodiment of the invention; and

DETAILED DESCRIPTION

Figure 4:
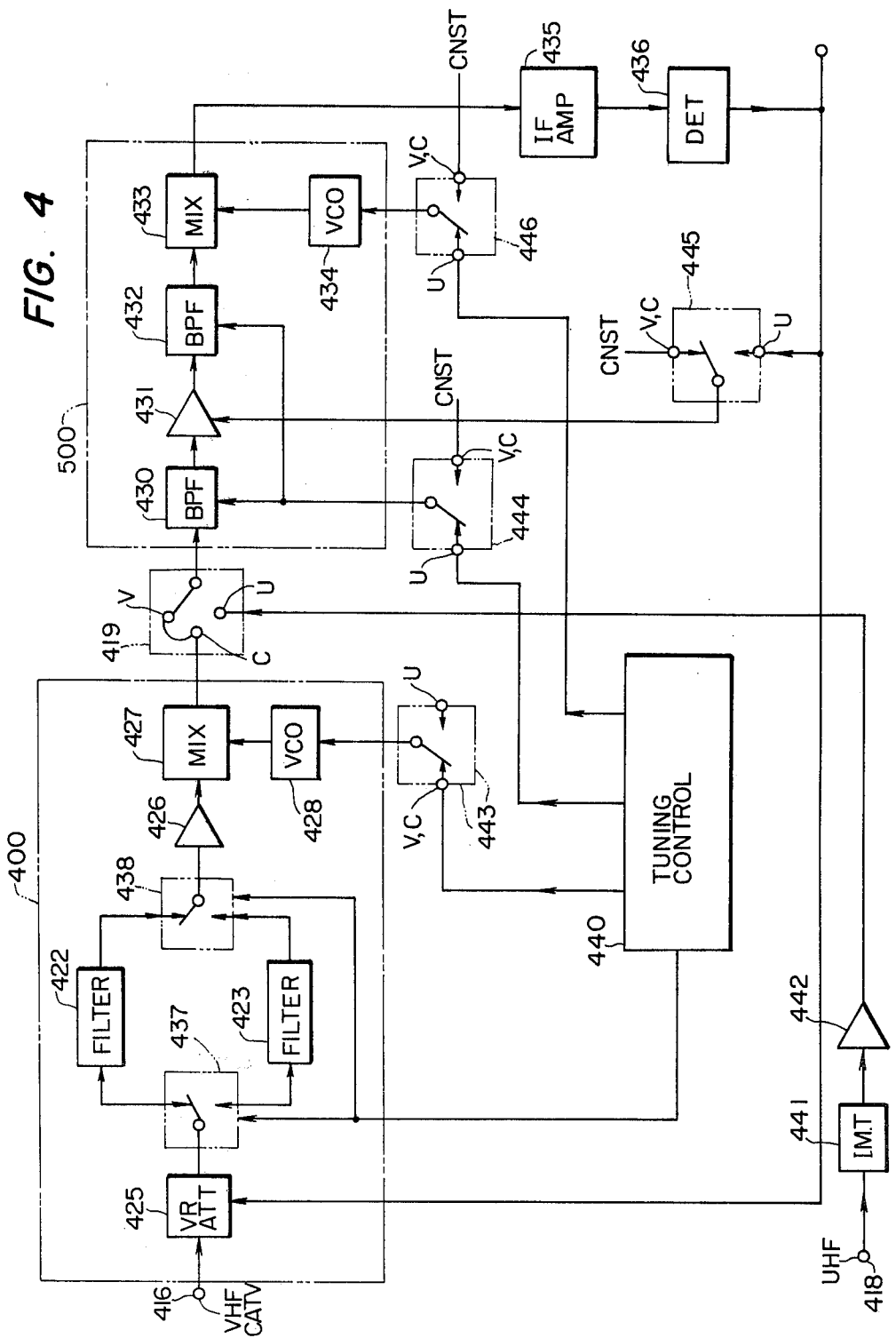
FIG. 4 is a block diagram of another embodiment of the invention.

Referring now to FIG. 1, there is shown a block diagram of a first preferred embodiment of the wideband tuner for VHF to UHF signals according to the present invention. The embodiment shown in FIG. 1 is a three-terminal tuner adapted to receive composite television signals in the VHF, CATV and UHF bands. The tuning circuit is controlled by a plurality of manually controlled band selector switches 7, 11, 12 and 23 which are all ganged together and provided with terminal positions designated V, C and U associated respectively for reception of VHF, CATV and UHF signals to selectively process signals received at input terminals 16, 17 and 18. The wideband tuner of the invention generally comprises three (3) tuning sections, shown in dotted lines, including VHF section 100, CATV section 200 and UHF section 300.

VHF signal, received at terminal 16, is coupled to a high-pass filter 1, thence to a tuning circuit 2, thence amplifier 3 and fed to an interstage tuning circuit 4 and applied to a mixer 5, also responsive to the signal from a local oscillator 6. Thus, the frequency of the VHF signal is converted to 45 MHz, the intermediate frequency of the VHF band. All the circuit elements of the VHF tuner 100 are of the general type, well known in the art. Reception of the VHF signals is effected by manually controlling the switches to move the positions thereof to the VHF channel designated V at switch 7. This couples the output of the mixer 5 to a video IF amplifier 8, having an output coupled to a detector 9 and applied to switch 11 as an automatic gain control signal.

CATV signals at frequencies in a range from 216 MHz to 408 MHz are applied to terminal 17 and through a high-pass filter 19 and coupled to a gain-controlled amplifier 20. A gain control signal is applied to the amplifier 20 through contacts 11a of switch 11 from the detector 9 when the television receiver is in a CATV reception mode. Amplifier 20 increases the received CATV signal to a level sufficient to compensate for a loss to be introduced by a mixer 21 in which the signal is converted to a UHF-band frequency of 850 MHz. Mixer 21, of a differential type, is supplied with a carrier at frequencies higher than the frequencies of the received CATV signals. A voltage controlled local oscillator 22 supplies the carrier in a frequency range from 1066 MHz to 1258 MHz in response to a d.c. control signal supplied from a tuning control circuit 10 through contacts 12a of switch 12. Because of the higher frequency values of the variable frequency oscillator 22 than the frequencies of the received CATV signals, the latter is modulated in the upper-side band differential mode. This mode of modulation is advantageous in that it significantly reduces the spurious components that fall within the converted IF band compared with the other modulation modes.

The d.c. control signal provided by the tuning control circuit 10 is varied by manual control of a channel selection knob, not shown. The d.c. control signal causes the voltage controlled oscillator 22 to generate the carrier frequency that is associated with a selected CATV channel.

The frequency converted CATV signal is coupled through switch 23 to the UHF tuning section 300 wherein it is passed through a tunable band-pass filter 24 to a gain-controlled amplifier 25. Amplifier 25 is supplied with a constant voltage through contacts 11b of switch 11 from the voltage source 13 so that it acts as a constant gain amplifier when the tuner is in the CATV reception mode. The amplified signal is then coupled to a second tunable band-pass filter 26. The tunable band-pass filters 24 and 26 are supplied with a predetermined constant voltage through switch 29 from the constant voltage source 13 so that they are tuned to 850 MHz to pass the frequency converted CATV signal. This double tuning system provides a high selectively with an attenuation of 65 dB to 75 dB at the image frequencies, which would cause undesirable interference. The selected CATV signal is coupled to a mixer 27 of a similar differential type as mixer 21 of CATV tuning section. The signal is modulated with a carrier from a voltage controlled local oscillator 28. During the CATV reception mode, local oscillator 28 is supplied with a constant voltage from a voltage source 13 through contacts 12b of switch 12 so that the carrier signal is maintained at a constant frequency of 805 MHz. Thus, the CATV signal is converted to 45 MHz, the intermediate frequency of the VHF band. Since the carrier frequency is lower than the frequency of the modulated signal, the mixer 27 is said to be operating in a lower-side band differential mode. The 45-MHz CATV signal is coupled through switch 7 to the intermediate frequency video amplifier 8 and thence to detector 9 to generate the gain control signal applied to the amplifier 20 of the CATV tuning section 200 to automatically vary the amplifier gain according to the received CATV signal.

It is seen that during the CATV reception mode the tuning sections 200 and 300 are cascaded and the received CATV signal is frequency converted on the upper-side band differential mode to a first intermediate frequency (850 MHz) in the CATV tuning section 200 and subsequently in the lower-side band differential mode to the 45-MHz intermediate frequency in the UHF tuning section 300.

When the switches are moved to the U terminal position, a UHF signal at terminal 18 is coupled to the UHF tuning section 300. In this mode, the active circuits of the CATV tuning section 200 are de-energized to disable the operation thereof. This disablement serves to reduce the leakage current of the antenna, not shown, and reduce the power consumption of the wideband tuner. Tunable filter 24 is now supplied with a tuning control signal from the circuit 10 through switch 29 so that it is tuned to any frequency in a range between 470 MHz and 890 MHz to permit selection of a desired UHF channel. The signal passing through filter 24 is coupled to the gain-controlled amplifier 25 which is now supplied with the output of the detector 9 through contacts 11b of switch 11 to effect the gain control function. The gain of amplifier 25 is automatically adjusted in response to the tuned UHF channel signal so that this signal is amplified to a level sufficient to compensate for losses introduced in the later stages. The amplified UHF signal is coupled to the second tunable filter 26 which is now supplied with the same tuning control signal as that supplied to filter 24, to be tuned to the same frequency as that of filter 24. Thus, the UHF channel signal is selected with a sharp separation from adjacent channel signals. The local oscillator 28 is supplied, at this time, with a varying control signal from the tuning control circuit 10 through contacts 12b of switch 12 to generate a carrier at a variable frequency in a range from 515 MHz to 935 MHz. The tuned UHF signal is modulated by the differential type mixer 27 with a corresponding carrier signal in that frequency range and converted into the 45-MHz intermediate frequency to be applied to the IF amplifier 8. Since the carrier frequencies are higher than the frequencies of the received UHF signal, the mixer 27 is said to be operating in an upper-side band differential mode.

The wideband tuner according to the invention has the benefits of low spurious content in the output to the IF video amplifier 18, low power comsumption, and high channel selectivity.

The embodiment of FIG. 1 is preferably modified as shown in FIG. 2 to further include an impedance matching transformer 31 and a wideband amplifier 32 coupled in series in the circuit between the UHF input terminal 18 and the U terminal of switch 23. The purpose of impedance matching transformer 31 is to obtain impedance match between the 300-ohm input impedance of the balanced UHF antenna feeder and the 75-ohm input impedance of the unbalanced circuit of the switch 23. The purpose of wideband amplifier 32 is to reduce the leakage current of the UHF antenna and to eliminate the reduction of the tuner gain resulting from interference between adjacent channels. Amplifier 32 also compensates for a loss introduced by the contacts of switch 23.

Referring now to FIG. 3 there is shown a second embodiment of the wideband tuner of the present invention. The wideband tuner of FIG. 2 generally comprises a VHF tuning section 101 which includes elements identical to those of the VHF tuning section 100 of FIG. 1, a CATV tuning section 201 and a UHF tuning section 301. The wideband tuner includes a single switch 43 having a V terminal connected to the output of VHF tuning section 101 which is identical to that shown in FIG. 1, a C terminal coupled to the output of CATV tuning section 201 and a U terminal coupled to the output of UHF tuning section 301. The CATV tuning section is identically constructed to the VHF section except for different frequency ranges. A CATV signal at terminal 17 is coupled to a high-pass filter 61, thence to a tuning circuit 62 and is coupled through an amplifier 63 and an interstage tuning circuit 64 to a mixer 65 to be modulated with a signal from a local oscillator 66 to convert the CATV signal to the intermediate frequency (45 MHz) of the VHF band. The 45-MHz CATV signal is then coupled to the C terminal of the switch 43.

Similarly, a UHF signal at terminal 18 is coupled to a tuning circuit 67, thence to an amplifier 68, then to an interstage tuning circuit 69 and to a mixer 70. A local oscillator 71 supplies the mixer 70 with a carrier signal which converts the UHF signal to the 45-MHz intermediate frequency of the VHF band, the modulated UHF signal being coupled to the U terminal of the switch 43.

A desired channel signal is coupled selectively through switch 43 to the IF video amplifier 8.

Referring now to FIG. 4 there is shown a third preferred embodiment of the wideband tuner of the present invention. The wideband tuner of FIG. 4 is a two-terminal tuner in which signals of the VHF and CATV channels are coupled from a first terminal 416 to a common VHF-CATV tuning section 400 for conversion to a specified frequency in the UHF band. The UHF signal is subsequently converted to the 45-MHz standard intermediate frequency of the VHF band in a UHF tuning section 500. A UHF signal is coupled from a second terminal 418 to the UHF tuning section through a switch 419.

VHF and CATV signals, applied to terminal 416, are coupled to a wideband variable attenuator 425 of the VHF-CATV tuning section 400. This variable attenuator receives a control signal from the detector 436 to automatically maintain the level of signals to be applied to a wideband amplifier 26 through a first input filter circuit 422 or a second input filter circuit 423. The first filter circuit 422 is designed to pass a low frequency band ranging from 54 MHz to 88 MHz (VHF low frequency channels) and a high frequency band ranging from 216 MHz to 408 MHz (including CATV super high and hyper frequency channels), while the second filter circuit 423 is designed to pass an intermediate frequency band ranging between 88 MHz and 216 MHz (including VHF medium and high frequency channels). This frequency allocation has the benefit of completely eliminating undesirable consequences arising from the second harmonic interferences and primary and secondary beat interferences.

The output of variable attenuator 425 is selectively coupled through the first or second filter circuit by means of switches 437 and 438 which are controlled by mode selecting signals supplied from a tuning circuit 440. The filtered and amplified VHF-CATV signals are coupled to a differential type mixer 427 and converted to 850 MHz by mixing it with a carrier supplied from a voltage controlled local oscillator 428. Local oscillator 428 is controlled by a tuning voltage supplied from the tuning control circuit 440 through a switch 443 when the tuner is in the VHF or CATV reception mode so that the carrier frequency varies in a range between 900 MHz and 1262 MHz. Thus, mixer 427 operates in an upper-side band differential mode. As previously described, this mode is advantageous for suppression of spurious components. During the VHF-CATV reception mode, a desired channel is selected and frequency converted by the mixer in response to the tuning control signal from the control circuit 440 and is supplied through switch 419 to a tunable band-pass filter 430 of UHF tuning section 500. This band-pass filter is supplied with a constant voltage through a switch 444 during the VHF-CATV reception mode to tune its center frequency to 850 MHz to pass the frequency converted signal from the VHF-CATV tuning section 400 to a gain-controlled amplifier 431. Gain-controlled amplifier 431 is controlled by a constant voltage supplied through a switch 445 during the VHF-CATV reception mode to amplify the signal with a constant gain. A second tunable band-pass filter 432 is connected to the output of amplifier 431. This band-pass filter is supplied with the same control signal as that supplied to the first band-pass filter 430 and constitutes a double tuning system therewith to provide a high degree of selectivity as previously described. The VHF-CATV signal is then coupled to a differential type mixer 433 to convert the VHF-CATV frequency to the standard 45-MHz intermediate frequency for application to an IF video amplifier 435. This is accomplished by a carrier signal at a constant frequency of 805 MHz supplied from a voltage controlled local oscillator 434 responsive to an input control voltage that is maintained constant during the VHF-CATV reception mode by a switch 446. The output of the IF video amplifier 435 is coupled to detector 436 which feeds the gain control signal to the variable attenuator 425 during the VHF-CATV reception mode.

In the UHF reception mode, switches 419, 443, 444, 445 and 446 are switched to the U terminal position. The switch 443 disconnects the control voltage to the local oscillator 426 and voltage supply to the active circuits of the VHF-CATV tuning section 400 in a manner identical to that described previously so that tuning section 400 is de-energized in the UHF reception mode. UHF signals, received at terminal 418, are coupled to an impedance matching transformer 441 and through a wideband amplifier 442 to the switch 419 whence it is coupled to the UHF tuning section. Tunable band-pass filters 430 and 432 are now supplied with a UHF tuning control signal from the tuning control circuit 440. A desired UHF channel is selected by the double tuning system. The gain-controlled amplifier 431 is now supplied with the output of the detector 436 to provide automatic gain control on the selected UHF signal. The local oscillator 434 is supplied with a control voltage from the tuning control circuit 440 so that the carrier frequency varies in a range from 515 MHz to 935 MHz. A carrier frequency corresponding to the tuned UHF signal is supplied to the mixer 433 to convert it to the standard 45-MHz intermediate frequency.

An important characteristic of the embodiment of FIG. 4 is a substantial reduction of circuit components and hence a low cost wideband tuner due to the common use the amplifier, mixer and local oscillator in the VHF-CATV tuning section 400.

What is claimed is:

1. A wideband tuner having a plurality of manually controlled selector switches for operating the tuner in one of first, second and third reception modes, comprising:
first, second and third input terminals adapted to receive signals of low, medium and high frequency bands in response to said first, second and third reception modes, respectively;
a first tuning section coupled to receive signals of the low frequency band from said first input terminal for converting the received signals to a lower intermediate frequency for application to an intermediate frequency video amplifier;
a second tuning section coupled to receive signals of the medium frequency band from said second input terminal for converting the received signals to a higher intermediate frequency;
a third tuning section for converting an input signal applied thereto to said lower intermediate frequency;
first switching means for selectively coupling to said third tuning section the output of said second tuning section in response to said second reception mode or signals of the high frequency band from said third input terminal in response to said third reception mode; and
second switching means for selectivey coupling to said video amplifier the output of said first tuning section in response to said first reception mode or the output of said third tuning section in response to said second or third reception mode;
said second tuning section including a first differential mode modulator for modulating a first carrier at a manually controlled frequency higher than the frequency of a medium frequency band modulating signal in response to said second reception mode, and said third tuning section including a second differential mode modulator for modulating a second carrier at a frequency lower than said higher intermediate frequency in response to said second reception mode and modulating a third carrier at a manually controlled frequency higher than the frequency of a high frequency band modulating signal in response to said third reception mode.

2. A wideband tuner as claimed in claim 1, further comprising means for generating a channel selecting signal in response to an operator action, wherein said second tuning section comprises:
an amplifier for amplifying signals from said second input terminal, the gain of said amplifier being controlled in response to a signal derived from the output of said video amplifier during said second reception mode;
a variable frequency oscillator for generating said first carrier at a frequency variable as a function of said channel selecting signal during said second reception mode, said variable frequency being higher than the frequency of said medium frequency band signals; and
a mixer for modulating said first carrier from said oscillator with modulating signals from said second input terminal for generating an output at a frequency which is the difference between the frequencies of said first carrier and the modulating signals.

3. A wideband tuner as claimed in claim 1, further comprising means for generating a channel selecting signal in response to an operator action, wherein said third tuning section comprises
a tunable band-pass filter coupled to receive signals from said first switching means, the center frequency of the tunable band-pass filter being controlled in response to said channel selecting signal during said third reception mode to tune to a signal of said high frequency band; and
an amplifier for amplifying signals from said tunable band-pass filter, the gain of said amplifier being controlled in response to a signal derived from the output of said video amplifier during said third reception mode;
a variable frequency oscillator for generating said second carrier at a frequency variable in response to said channel selecting signal during said third reception mode, said variable frequency being higher than the frequency of a signal derived from said amplifier during said third reception mode; and
a mixer for modulating said second carrier from said oscillator with a modulating signal from said amplifier for generating an output at a frequency which is the difference between the frequencies of said second carrier and said modulating signal.

4. A wideband tuner as claimed in claim 3, further comprising means for causing said variable frequency oscillator to supply a carrier at a constant frequency lower than said higher intermediate frequency to said mixer during said second reception mode.

5. A wideband tuner as claimed in claim 1, 2, 3 or 4, further comprising means for causing said second tuning section to be de-energized during said second reception mode.

6. A wideband tuner as claimed in claim 1, 2, 3, or 4, further comprising an impedance matching transformer and a wideband amplifier connected in series between said third input terminal and said first switching means.

7. A wideband tuner as claimed in claim 3, further comprising means for causing said tunable band-pass filter to be tuned to said higher intermediate frequency during said first and second reception modes.

8. A wideband tuner as claimed in claim 3 or 7, further comprising a second tunable band-pass filter coupled between the output of said amplifier and the input of said mixer, said second tunable band-pass filter being controlled in unison with the first-mentioned tunable band-pass filter to constitute a double tuning system therewith.

9. A wideband tuner having a plurality of manually controlled selector switches for operating the tuner in one of low, medium and high frequency band reception modes, comprising:
a first input terminal adapted to receive signals of low and medium frequency bands in response to said low and medium frequency band reception modes, respectively;
a second input terminal adapted to receive signals of a high frequency band in response to said high frequency band reception mode;
a first tuning section coupled to receive signals of the low and medium frequency bands from said first input terminal for converting the received signals to a higher intermediate frequency;
a second tuning section for converting an input signal applied thereto to a lower intermediate frequency for application to an intermediate frequency video amplifier;
switching means for selectively coupling to said second tuning section the output of said first tuning section in response to said low or medium frequency band reception mode or signals of the high frequency band from said second input terminal in response to said high frequency band reception mode; means for generating a channel selecting signal in response to an operator action
said first tuning section comprising:
a first filter having a first passband of low frequency range in said low frequency band and a second passband of high frequency range in said medium frequency band;
a second filter having a passband of frequencies intermediate between said low and high frequency ranges;
second switching means for selectively passing signals from said first input terminal through said first or second filter in response to said low and medium frequency band reception modes;
a variable frequency oscillator for generating a carrier at a frequency variable as a function of said channel selecting signal during said low and medium frequency band reception modes, said variable frequency being higher than the frequency of the signal passing through said first or second filter; and
a mixer for modulating said carrier with modulating signals from said first or second filter for generating an output at a frequency which is the difference between the frequencies of said carrier and the modulating signals.

10. A wideband tuner as claimed in claim 9, wherein said first tuning section further comprises:
an attenuator for attenuating signals from said first input terminal for application to one of said first and second filters through said switching means, the attenuation of said attenuator being controlled in response to a signal derived from said intermediate frequency video amplifier; and
a wideband amplifier for amplifying the output of said first and second filters for application to said mixer.

11. A wideband tuner as claimed in claim 9, wherein said second tuning section comprises
a tunable band-pass filter coupled to receive signals from said switching means, the center frequency of the tunable band-pass filter being controlled in response to said channel selecting signal during said high frequency band reception mode to tune to a signal of said high frequency band; and
an amplifier for amplifying signals from said tunable band-pass filter, the gain of said amplifier being controlled in response to a signal derived from said video amplifier during said high frequency band reception mode;
a variable frequency oscillator for generating a carrier at a frequency variable in response to said channel selecting signal during said high frequency band reception mode, said variable frequency being higher than the frequency of a signal derived from said amplifier during said high frequency band reception mode; and
a mixer for modulating said carrier with a modulating signal from said amplifier for generating an output at a frequency which is the difference between the frequencies of said carrier and said modulating signal.

12. A wideband tuner as claimed in claim 9, 10, or 11 further comprising means for causing said first tuning section to be de-energized in response to said high frequency band reception mode.

13. A wideband tuner as claimed in claim 9, 10, or 11, further comprising an impedance matching transformer and a wideband amplifier coupled in series between said second input terminal and said switching means.

14. A wideband tuner as claimed in claim 11, further comprising means for causing said variable frequency oscillator to supply a carrier at a constant frequency lower than said higher intermediate frequency to said mixer during said high frequency band reception mode.

15. A wideband tuner as claimed in claim 14, further comprising means for causing said tunable band-pass filter to be tuned to said higher intermediate frequency during said low and medium frequency band reception modes.

16. A wideband tuner as claimed in claim 14 or 15, further comprising a second tunable band-pass filter coupled between the output of said amplifier and the input of said mixer, said second tunable band-pass filter being controlled in unison with the first-mentioned tunable band-pass filter to constitute a double tunin system therewith.

* * * * *